United States Patent
Kim et al.

(10) Patent No.: US 8,896,396 B2
(45) Date of Patent: Nov. 25, 2014

(54) LOW PASS FILTER USING BULK ACOUSTIC WAVE RESONATOR (BAWR)

(75) Inventors: Chul Soo Kim, Hwaseong-si (KR); Jun Chul Kim, Seongnam-si (KR); In Sang Song, Osan-si (KR); Young Il Kim, Suwon-si (KR); Duck Hwan Kim, Goyang-si (KR); Sang Uk Son, Yongin-si (KR); Jea Shik Shin, Hwaseong-si (KR); Hyung Rak Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 415 days.

(21) Appl. No.: 13/307,159

(22) Filed: Nov. 30, 2011

(65) Prior Publication Data

US 2012/0139664 A1 Jun. 7, 2012

(30) Foreign Application Priority Data

Dec. 3, 2010 (KR) ..................... 10-2010-0122794

(51) Int. Cl.
*H03H 9/54* (2006.01)
*H03H 9/56* (2006.01)
*H03H 9/60* (2006.01)

(52) U.S. Cl.
CPC .............. *H03H 9/542* (2013.01); *H03H 9/568* (2013.01); *H03H 9/605* (2013.01)
USPC ........................ 333/189; 333/191; 333/192

(58) Field of Classification Search
CPC ....... H03H 9/542; H03H 9/547; H03H 9/566; H03H 9/568; H03H 9/605; H03H 9/6409; H03H 9/6423; H03H 2011/0488
USPC ............ 333/187, 189, 191, 192, 133
See application file for complete search history.

(56) References Cited

U.S. PATENT DOCUMENTS

| | | | | |
|---|---|---|---|---|
| 1,795,204 A | * | 3/1931 | Espenschied | 333/189 |
| 5,760,663 A | * | 6/1998 | Pradal | 333/187 |
| 5,933,062 A | * | 8/1999 | Kommrusch | 333/193 |
| 6,081,171 A | | 6/2000 | Ella | |

(Continued)

FOREIGN PATENT DOCUMENTS

| JP | 2004-242281 A | | 8/2004 |
|---|---|---|---|
| JP | 2006-238101 | * | 9/2006 |

(Continued)

OTHER PUBLICATIONS

English language machine translation of JP 2009-296167, published on Dec. 17, 2009.*

(Continued)

*Primary Examiner* — Barbara Summons
(74) *Attorney, Agent, or Firm* — NSIP Law

(57) ABSTRACT

Provided are low pass filters using a bulk acoustic wave resonator (BAWR). A low pass filter may include an input terminal configured to be connected with a first radio frequency (RF) device, an output terminal configured to be connected with a second RF device, a parallel segment including a first BAWR, a third BAWR, and a fifth BAWR that may be connected in parallel with each other to a reference potential, a first series segment having a second BAWR and a first inductor, and a second series segment having a fourth BAWR and a second inductor, and connected in series with the first series segment.

15 Claims, 4 Drawing Sheets

(56) References Cited

U.S. PATENT DOCUMENTS

| | | | |
|---|---|---|---|
| 6,714,099 B2 * | 3/2004 | Hikita et al. | 333/133 |
| 6,879,224 B2 * | 4/2005 | Frank | 333/189 |
| 6,995,631 B2 * | 2/2006 | Taniguchi | 333/133 |
| 7,135,940 B2 * | 11/2006 | Kawakubo et al. | 333/17.1 |
| 7,145,417 B2 * | 12/2006 | Kimachi et al. | 333/189 |
| 7,385,464 B2 * | 6/2008 | Shibagaki et al. | 333/133 |
| 7,876,178 B2 * | 1/2011 | Tamura | 333/193 |
| 7,940,145 B2 * | 5/2011 | Isobe et al. | 333/187 |
| 2004/0119561 A1 * | 6/2004 | Omote | 333/133 |
| 2007/0052494 A1 * | 3/2007 | Shibagaki et al. | 333/133 |
| 2007/0268092 A1 * | 11/2007 | Inoue et al. | 333/133 |
| 2009/0051457 A1 * | 2/2009 | Bauer et al. | 333/4 |
| 2009/0189714 A1 * | 7/2009 | Sakisaka et al. | 333/185 |
| 2009/0251235 A1 | 10/2009 | Belot et al. | |
| 2010/0026417 A1 * | 2/2010 | Kubat et al. | 333/133 |
| 2010/0134203 A1 * | 6/2010 | Inoue et al. | 333/133 |

FOREIGN PATENT DOCUMENTS

| | | | |
|---|---|---|---|
| JP | 2007 060412 A | | 3/2007 |
| JP | 2007-124539 | * | 5/2007 |
| JP | 2009-182368 A | | 8/2009 |
| JP | 2009-296167 A | | 12/2009 |
| KR | 10-2010-0087617 | | 8/2010 |

OTHER PUBLICATIONS

English language machine translation of JP 2007-124539, published on May 17, 2007.*

English language machine translation of JP 2006-238101, published Sep. 7, 2006.*

* cited by examiner

LOW PASS FILTER USING BULK ACOUSTIC WAVE RESONATOR (BAWR)

CROSS-REFERENCE TO RELATED APPLICATION

This application claims the benefit under 35 U.S.C. §119(a) of Korean Patent Application No. 10-2010-0122794, filed on Dec. 3, 2010, in the Korean Intellectual Property Office, the entire disclosure of which is incorporated herein by reference for all purposes.

BACKGROUND

1. Field

The following description relates to a radio frequency (RF) filter using a bulk acoustic wave resonator (BAWR).

2. Description of Related Art

Generally, a bulk acoustic wave resonator (BAWR) is typically used in a filter or a duplexer, and, more particularly, often used in a band pass filter. In a use such as a band pass filter, a characteristic of band pass may be determined by a resonant frequency of the BAWR constituting the filter.

Because of the continually developing reduction in the size of a mobile transmission and reception apparatus, the sizes of parts used in the fabrication of the mobile transmission and reception apparatus may need to become smaller. Various types of filters may be provided in the mobile transmission and reception apparatus, and thus there is a desire for both a high performance filter and a small size filter.

SUMMARY

In one general aspect, there is provided a low pass filter using a bulk acoustic wave resonator (BAWR), including an input terminal configured to be connected with a first radio frequency (RF) device, an output terminal configured to be connected with a second RF device, a parallel segment comprising a first BAWR, a third BAWR, and a fifth BAWR that are connected in parallel with one another to a reference potential, a first series segment having a second BAWR and a first inductor, and a second series segment having a fourth BAWR and a second inductor, and connected in series with the first series segment, wherein, a resonant frequency of the second BAWR and a resonant frequency of the fourth BAWR are different values, and the output terminal outputs to the second RF device one or more signals having a frequency lower than a predetermined frequency among signals input from the first RF device.

The second BAWR and the first inductor may be connected in parallel with each other, and the fourth BAWR and the second inductor may be connected in parallel with each other.

The parallel segment may further include a first capacitor connected in parallel with the first BAWR, a second capacitor connected in parallel with the third BAWR, and a third capacitor connected in parallel with the fifth BAWR.

The parallel segment may further include one or more capacitors being respectively connected in parallel with the first BAWR, the third BAWR, the fifth BAWR, or any combination thereof.

A resonant frequency of the second BAWR and a resonant frequency of the third BAWR may have equivalent values, and a resonant frequency of the fourth BAWR and a resonant frequency of the fifth BAWR may have equivalent values.

A resonant frequency of the first BAWR and a resonant frequency of the second BAWR may have equivalent values, and a resonant frequency of the third BAWR and a resonant frequency of the fourth BAWR may have equivalent values.

In another general aspect, there is provided a low pass filter using a BAWR, including an input terminal configured to be connected with a first radio frequency (RF) device, an output terminal configured to be connected with a second RF device, a parallel segment including a first capacitor, a second capacitor, and a third capacitor that are connected in parallel with one another to a reference potential, a first series segment having a first BAWR and a first inductor, and a second series segment having a second BAWR and a second inductor, and connected in series with the first series segment, wherein a resonant frequency of the first BAWR and a resonant frequency of the second BAWR are different values, and the output terminal outputs to the second RF device one or more signals having a frequency lower than a predetermined frequency among signals input from the first RF device.

The parallel segment may further include one or more BAWRs being respectively connected in parallel with the first capacitor, the second capacitor, the third capacitor, or any combination thereof.

In another general aspect, there is provided a low pass filter using a BAWR, including an input terminal configured to be connected with a first radio frequency (RF) device, a first BAWR configured to be connected to the input terminal, a first ladder being connected to the input terminal and the first BAWR, and including a second BAWR, a first inductor, and a third BAWR, a second ladder being connected in series with the first ladder, and comprising a fourth BAWR, a second inductor, and a fifth BAWR, and an output terminal being connected to the second ladder, and configured to be connected with a second RF device, wherein the second BAWR and the fourth BAWR are connected in series with each other, the third BAWR and the fifth BAWR are connected in parallel with each other, the second BAWR and the first inductor are connected in parallel with each other, and the fourth BAWR and the second inductor are connected in parallel with each other, and a resonant frequency of the second BAWR and a resonant frequency of the fourth BAWR are different values, and the output terminal outputs to the second RF device one or more signals having a frequency lower than a predetermined frequency among signals input from the first RF device.

The filter may further include a third ladder connected in series between the first and the second ladder, and comprising a sixth BAWR, a third inductor, and a seventh BAWR, wherein the second BAWR, the fourth BAWR, and the sixth BAWR are connected in series with one another, and a resonant frequency of the second BAWR, a resonant frequency of the fourth BAWR, and a resonant frequency of the sixth BAWR are different values.

In another general aspect, there is provided a low pass filter using a bulk acoustic wave resonator (BAWR), including an input terminal, an output terminal, a first series segment having a first bulk acoustic wave resonator (BAWR) and a first inductor connected in parallel, and a second series segment having a second BAWR and a second inductor connected in parallel, wherein the first and second series segments are connected in series between the input and output terminals.

The filter may further include a third BAWR connected between a reference potential and the input terminal, a fourth BAWR connected between the reference potential and a point between the first and second series segments, and a fifth BAWR connected between the reference potential and the output terminal, wherein the third, fourth, and fifth BAWR are connected in parallel.

The first BAWR may have a same resonance frequency as one of the third, fourth, and fifth BAWRs, and the second BAWR may have the same resonance frequency as another one of the third, fourth, and fifth BAWRs.

The filter may further include first, second, and third capacitors respectively connected in parallel with the third, fourth, and fifth BAWRs.

The filter may further include a first capacitor connected between a reference potential and the input terminal, a second capacitor connected between the reference potential and a point between the first and second series segments, and a third capacitor connected between the reference potential and the output terminal, wherein the first, second, and third capacitors are connected in parallel.

The first and second BAWRs may have different resonance frequencies.

A low pass filter may be configured to have a low inductance, using BAWRs of series segments, each having a different resonant frequency.

A size of a low pass filter may be reduced, using BAWRs of series segments, each having a different resonant frequency, and thus integration may be easily achieved.

A high performance low pass filter having a characteristic of a sharp skirt in a cutoff frequency may be configured, using BAWRs of series segments, each having a different resonant frequency.

Other features and aspects will be apparent from the following detailed description, the drawings, and the claims.

Figure 1A:
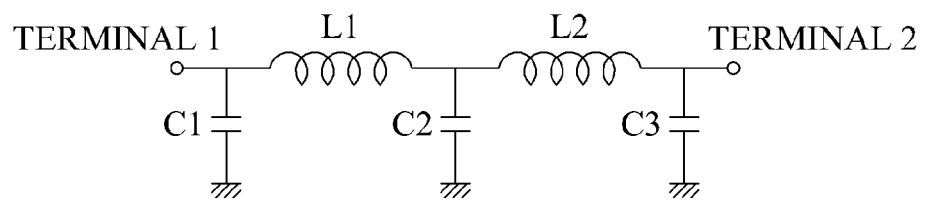
FIG. 1A is a diagram illustrating a conventional five-stage low pass filter.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, description of well-known functions and constructions may be omitted for increased clarity and conciseness.

A low pass filter using a bulk acoustic wave resonator (BAWR) according to various examples may be provided in a mobile device, thereby being applicable to a wireless mobile communication service field. The low pass filter using the BAWR may perform a filtering function to remove a signal harmonic from the mobile device, such as, for example, a radio frequency (RF) transceiver. Also, the low pass filter using the BAWR may be used in a phase shifter having a characteristic of harmonic removal.

The BAWR may use an acoustic wave of a piezoelectric material. In a case in which an RF signal is applied to a piezoelectric material such as, for example, an aluminum nitride (AlN), a mechanical vibration may occur in a direction of a thickness of a piezoelectric film, and an acoustic wave may be generated. A resonance phenomenon may occur in an example in which a half of a wavelength of an applied RF signal corresponds to the thickness of the piezoelectric film. In a case in which the resonance phenomenon occurs, electrical impedance may sharply change, and thus may be used as a filter to enable selecting a frequency. A resonance frequency may be determined based on a thickness of a piezoelectric film, an electrode covering the piezoelectric film, a speed of an intrinsic acoustic wave of the piezoelectric film, and the like. For example, in a case in which the thickness of the piezoelectric film becomes thinner, the resonance frequency may be greater.

Throughout the descriptions of the various examples that follow, the term connection may refer to an electrical connection through which a signal is transferred. However, it is not necessary that a physical connection, e.g., wired connection, exists between the two discussed components. For example, two components may respectively transmit and receive a signal in a wireless fashion, yet may still be referred to as being connected.

FIG. 1A illustrates a conventional five-stage low pass filter.

Referring to FIG. 1A, the conventional five-stage low pass filter may be configured with a first inductor L1 and a second inductor L2 that may be connected in series between a first and second terminal, and a first capacitor C1, a second capacitor C2, and a third capacitor C3 that may be connected in parallel with one another. In this conventional five-stage low pass filter, each of the inductors and each of the capacitors may be configured on a printed circuit board substrate and a low temperature co-fired ceramic substrate.

In a case in which a frequency of a stopband becomes lower, a size of the inductors may be increased. Accordingly, inductors of an even greater size may be needed in order to configure a high performance low pass filter. However, the size of a mobile device using the low pass filter is generally becoming smaller. Thus, a low pass filter that may be small, but perform equally well or better, may be needed.

The low pass filter using the BAWR according to various examples discussed herein may provide a low pass filter that may perform equally or better than the conventional filter, and may include one or more inductors of a relatively small size, using BAWRs, each having a different resonance frequency, being connected in series with one another.

Figure 1B:
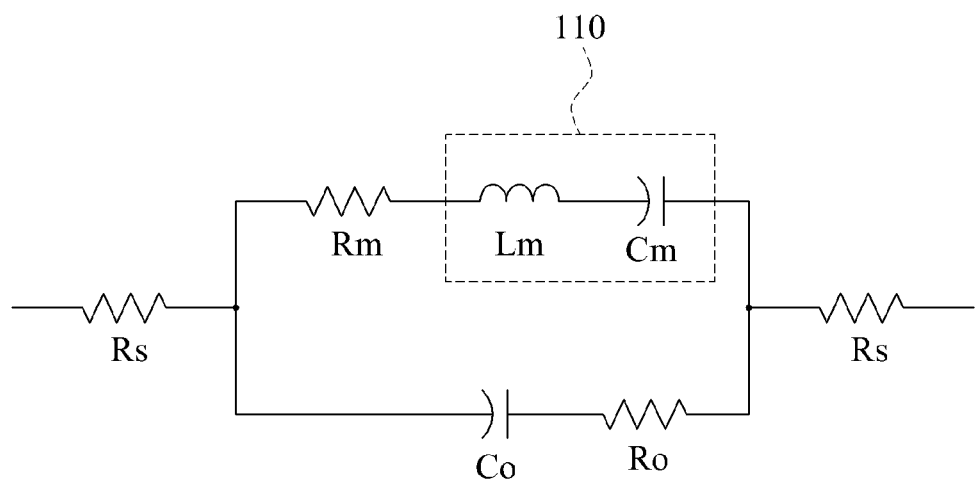
FIG. 1B is a diagram illustrating an equivalent circuit of a conventional bulk acoustic wave resonator (BAWR).

FIG. 1B includes an equivalent circuit of a conventional BAWR.

Referring to FIG. 1B, the conventional BAWR may be represented as an equivalent circuit including resistances, inductors, and capacitors. Rs may indicate an ohmic loss by an electrode, and the like, Ro may indicate a basic resistance value of a material, and Co may correspond to a static capacitor, and may indicate a basic capacitor value that a resonator physically has. Lm, Cm, and Rm may indicate impedance values that may be changed by the surrounding environment. The resonance frequency may correspond to a value that may be changed by a multiplication of Lm and Cm 110, and may be changed based on, for example, a physical thickness of a material including an electrode, a physical property of the material, a mass of the material, a temperate of the material, and the like.

Figure 2:
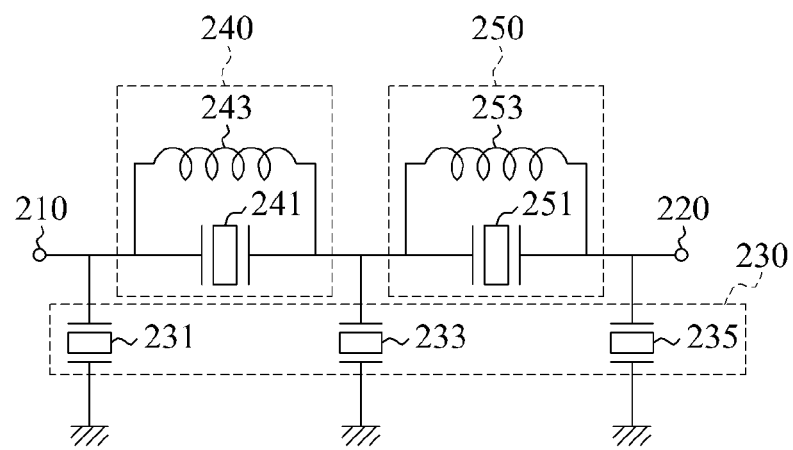
FIG. 2 is a diagram illustrating an example configuration of a low pass filter using a BAWR.

FIG. 2 includes an example configuration of a low pass filter using a BAWR.

Referring to the example illustrated in FIG. 2, the low pass filter using the BAWR may include an input terminal 210, an output terminal 220, a parallel segment 230, a first series segment 240, and a second series segment 250. The first series segment 240 and second series segment 250 refer to two segments that are in series between the input terminal 210 and output terminal 220.

The input terminal 210 may be connected with a first RF device. The input terminal 210 may receive a signal from the first RF device.

The output terminal 220 may be connected with a second RF device. The output terminal 220 may transfer, to the second RF device, a signal that has been low-pass filtered using the parallel segment 230, the first series segment 240, and the second series segment 250. That is, the output terminal 220 may output, to the second RF device, signals having a frequency lower than a predetermined frequency among signals input from the first RF device.

The parallel segment 230 may include a first BAWR 231, a third BAWR 233, and a fifth BAWR 235 that may be connected in parallel with one another, between the input terminal 210 and the output terminal 220. The parallel segment 230 may include at least three BAWRs.

The first series segment 240 may be connected to the parallel segment 230. The first segment 240 may include a second BAWR 241 and a first inductor 243. The second BAWR 241 and the first inductor 243 may be connected in parallel between two points at which the first series segment 240 is connected with the parallel segment 230.

The second series segment 250 may also be connected to the first series segment 240. The second series segment 250 may include a fourth BAWR 251 and a second inductor 253. The fourth BAWR 251 and the second inductor 253 may be connected in parallel between two points at which the second series segment 250 is connected with the parallel segment 230.

In this example configuration, a resonance frequency of the second BAWR 241 of the first series segment 240, and a resonance frequency of the fourth BAWR 251 of the second series segment 250, may be different values. Also, an antiresonance frequency of the second BAWR 241 of the first series segment 240, and an antiresonance frequency of the fourth BAWR 251 of the second series segment 250, may be different values.

A resonance frequency of a BAWR may be determined based on, for example, a thickness of a piezoelectric film, an electrode covering the piezoelectric film, a speed of an intrinsic acoustic wave of the piezoelectric film, and the like. For example, different resonance frequencies may be determined based on a difference between a thickness of a piezoelectric film of the second BAWR 241 and a thickness of a piezoelectric film of the fourth BAAWR 251.

A low pass filter may be configured using the second BAWR 241 and the fourth BAWR 251, each having a different resonance frequency. That is, signals having a frequency lower than a predetermined frequency among signals input from the first RF device may be output to the second RF device.

Also, a high performance low pass filter having a low inductance may be configured by connecting the second BAWR 241 and the first inductor 243 in parallel. More particularly, an inductor having a low inductance may be configured using an inductor that may be connected in parallel with an inductor component of a BWAR.

For example, in a case in which a filter is provided with a conventional inductor and a conventional capacitor, inductance of the inductor may have a value such as 7.1 nH. However, in a case in which multiple BAWRs, each having a different resonance frequency, are used according to various examples discussed herein, the inductance of the inductor that may be connected in parallel with the BAWRs may have a value such as 3.9 nH. That is, the inductor having an inductance of 3.9 nH that may be connected in parallel with the other BAWRs may be used to operate equivalently to the inductor having an inductance of 7.1 nH. Accordingly, a small-size inductor may be used, and a size of the low pass filter may be reduced.

In a case in which the second inductor 253 is connected in parallel with the fourth BAWR 251, as illustrated in FIG. 2, an inductor having small inductance may also be configured.

In order to more easily configure a low pass filter, the resonance frequency of the second BAWR 241 and a resonance frequency of the third BAWR 233 may be set to equivalent values, and the resonance frequency of the fourth BAWR 251 and a resonance frequency of the fifth BAWR 235 may be set to equivalent values. In such an example, the resonance frequency of the second BAWR 241 and the resonance frequency of the fourth BAWR 251 may be still different values. Setting equivalent values between inductors such as the second BAWR 241 and third BAWR 233 may ease the design and implementation of the filter, as a process of configuring a filter may be complex and difficult in cases in which there are many BAWRs having different resonance frequencies.

In other example configurations, a resonance frequency of the first BAWR 231 and the resonance frequency of the second BAWR 241 may be set to equivalent values, and a resonance frequency of the third BAWR 233 and the resonance frequency of the fourth BAWR 251 may be set to equivalent values.

Also, the resonance frequency of the second BAWR 241 and the resonance frequency of the third BAWR 233 may be set to equivalent values, and the resonance frequency of the first BAWR 231, the resonance frequency of the fourth BAWR 251, and the resonance frequency of the fifth BAWR 235 may be set to equivalent values.

Similarly, the resonance frequency of the first BAWR 231, the resonance frequency of the second BAWR 241, and the resonance frequency of the fifth BAWR 235 may be set to equivalent values, and the resonance frequency of the third BAWR 233 and the resonance frequency of the fourth BAWR 251 may be set to equivalent values.

Also, as indicated in the example configuration illustrated in FIG. 2, five BAWRs may be used to configure the five-stage low pass filter; however, a multi-stage low pass filter may be configured by connecting a series segment including an additional BAWR, and a parallel segment including an additional BAWR.

Figure 3:
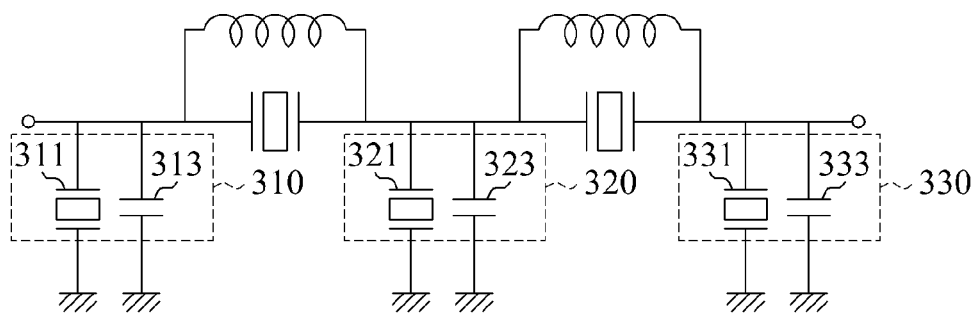
FIG. 3 is a diagram illustrating another example configuration of a low pass filter using a BAWR.

FIG. 3 illustrates another example configuration of a low pass filter using a BAWR.

Referring to FIG. 3, the low pass filter using the BAWR may have a configuration of a parallel segment that differs from the example illustrated in FIG. 2.

At least one of a first parallel segment 310, a second parallel segment 320, and a third parallel segment 330 may include a BAWR and a capacitor. A capacitor component of a filter may be changed, and a resonance frequency may be changed, by connecting the capacitor and the BAWR in parallel.

In this example, the first parallel segment 310 may include a first BAWR 311 and a first capacitor 313. The first BAWR 311 and the first capacitor 313 may be connected in parallel between a terminal and a reference potential such as, for example, ground.

The second parallel segment 320 may include a third BAWR 321 and a second capacitor 323. The third BAWR 321 and the second capacitor 323 may be connected in parallel between a connection point of two series segments and the reference potential.

Figure 4:
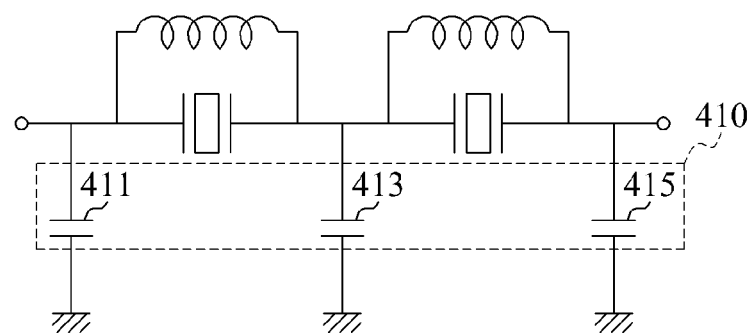
FIG. 4 is a diagram illustrating still another configuration of a low pass filter using a BAWR.

The third parallel segment 330 may include a fifth BAWR 331 and a third capacitor 333. The fifth BAWR 331 and the third capacitor 333 may be connected in parallel between another terminal and the reference potential. FIG. 4 illustrates still another example configuration of a low pass filter using a BAWR.

Referring to FIG. 4, the low pass filter using the BAWR may have a configuration of a parallel segment that differs from the previously discussed examples.

A parallel segment 410 may include a first capacitor 411, a second capacitor 413, and a third capacitor 415. That is, in order to perform a function of a low pass filter, BAWRs, each having a different resonance frequency may be connected in series with one another, and the other components of the filter, which may be connected in parallel from a reference potential such as ground, may be configured with a capacitor.

The parallel segment 410 may include a BAWR that may be connected in parallel with at least one of the first capacitor 411, the second capacitor 413, and the third capacitor 415. A characteristic of the low pass filter may be improved by connecting the capacitor and the BAWR in parallel.

Figure 5:
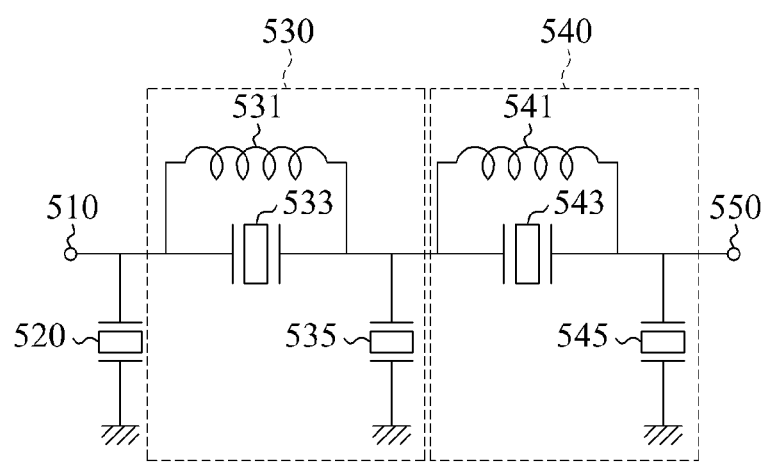
FIG. 5 is a diagram illustrating yet another configuration of a low pass filter using a BAWR.

FIG. 5 illustrates yet another example configuration of a low pass filter using a BAWR.

Referring to FIG. 5, the low pass filter using the BAWR may include an input terminal 510, a first BAWR 520, a first ladder 530, a second ladder 540, and an output terminal 550.

The input terminal 510 may be connected with a first RF device. The input terminal 510 may receive a signal from the first RF device. The first BAWR 520 may be connected to the input terminal 510.

The first ladder 530 may be connected to the terminal 510 and the first BAWR 520. The first ladder 530 may include a first inductor 531, a second BAWR 533, and a third BAWR 535. The first inductor 531 and the second BAWR 533 may be connected in parallel with each other.

The second ladder 540 may be connected in series with the first ladder 530. The second ladder 540 may include a second inductor 541, a fourth BAWR 543, and a fifth BAWR 545. The second inductor 541 and the fourth BAWR 543 may be connected in parallel with each other.

In this example, the second BAWR 533 and the fourth BAWR 543 may be connected in series with each other, and the third BAWR 535 and the fifth BAWR 545 may be connected in parallel with each other. A resonance frequency of the second BAWR 533 and a resonance frequency of the fourth BAWR 543 may be different values. Also, an antiresonance frequency of the second BAWR 533 and an antiresonance frequency of the fourth BAWR 543 may be different values.

A low pass filter may be configured using the second BAWR 533 and the fourth BAWR 543 having different resonance frequencies. That is, signals having a frequency lower than a predetermined frequency among signals input from the first RF device may be output to a second RF device.

The output terminal 550 may be connected with the second RF device. The output terminal 550 may transfer, to the second RF device, a signal that has been low-pass filtered using the first BAWR 520, the first ladder 530, and the second ladder 540.

Although, in FIG. 5, the first ladder 530 and the second ladder 540 are illustrated as being provided between the input terminal 510 and the output terminal 550, the low pass filter using the BAWR according to another example configuration may further include an additional ladder that may be connected in series with the second ladder 540. A multi-stage low pass filter may be configured by further including an additional ladder.

Figure 6:
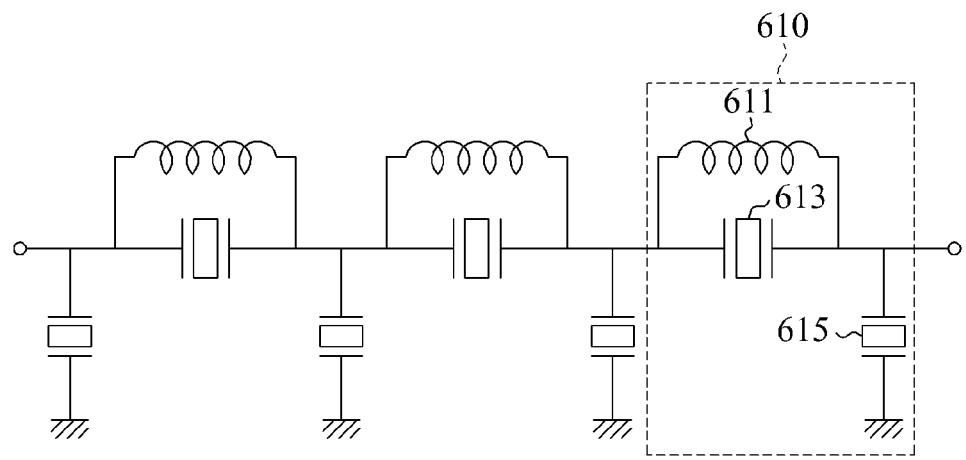
FIG. 6 is a diagram illustrating still another configuration of a low pass filter using a BAWR.

FIG. 6 illustrates still another configuration of a low pass filter using a BAWR.

Referring to FIG. 6, the low pass filter using the BAWR may correspond to a configuration in which a third ladder 610 may be added to the low pass filter using the BAWR of FIG. 5.

The third ladder 610 may include a third inductor 611, a sixth BAWR 613, and a seventh BAWR 615. The third inductor 611 and the sixth BAWR 613 may be connected in parallel with each other. The sixth BAWR 613 may be connected in series with the second BAWR 533 and the fourth BAWR 543.

In this example, a resonance frequency of the sixth BAWR 613 may have a value different from the resonance frequency of the second BAWR 533 and the resonance frequency of the fourth BAWR 543, and thereby a low pass filtering function may be performed.

Figure 7:
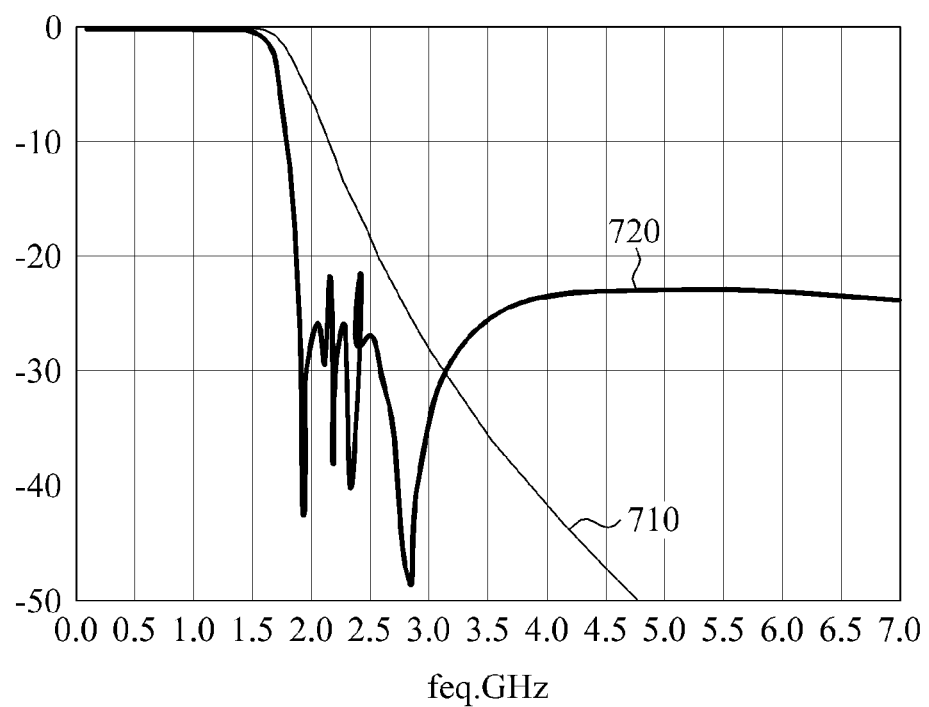
FIG. 7 is a graph illustrating an effect of a low pass filter using a BAWR.

FIG. 7 illustrates an effect of a low pass filter using a BAWR.

When comparing a characteristic 710 of a low pass filter including a conventional inductor and a conventional capacitor, and a characteristic 720 of a low pass filter using a BAWR according to an example, in case of the low pass filter using the BAWR, a sharp skirt phenomenon may be observed in a cutoff frequency. That is, the conventional low pass filter may have a gentle gradient in a stopband, whereas the low pass filter using the BAWR may have a sharp gradient in the stopband. Thus, the characteristic of the low pass filter may be improved. In the graph of FIG. 7, an x-axis indicates a frequency, and a y-axis indicates strength of a signal, for example, dB.

The low pass filter using the BAWR according to various examples such as those discussed herein may be used to configure a filter bank including a band pass filter and a low pass filter. The filter bank may be provided in, for example, a mobile device that may use a wireless network.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A low pass filter using a bulk acoustic wave resonator (BAWR), the filter comprising:
   an input terminal configured to be connected with a first radio frequency (RF) device;
   an output terminal configured to be connected with a second RF device;
   a parallel segment comprising a first BAWR, a third BAWR, and a fifth BAWR that are connected in parallel with one another to a reference potential;
   a first series segment having a second BAWR and a first inductor; and a second series segment having a fourth BAWR and a second inductor, and connected in series with the first series segment, wherein a resonance frequency of the second BAWR and a resonance frequency of the fourth BAWR have different values, wherein:
   the second BAWR has a same resonance frequency as one of the first, third, and fifth BAWRs;
   the fourth BAWR has a same resonance frequency as one of the first, third, and fifth BAWRs; or
   the second BAWR has a same resonance frequency as one of the first, third, and fifth BAWRs, and the fourth BAWR has a same resonance frequency as another one of the first, third, and fifth BAWRs; and wherein the output terminal is configured to output to the second RF device one or more signals having a frequency lower than a predetermined frequency among signals input from the first RF device.

2. The filter of claim 1, wherein:
the second BAWR and the first inductor are connected in parallel with each other, and
the fourth BAWR and the second inductor are connected in parallel with each other.

3. The filter of claim 1, wherein the parallel segment further comprises:
a first capacitor connected in parallel with the first BAWR;
a second capacitor connected in parallel with the third BAWR; and
a third capacitor connected in parallel with the fifth BAWR.

4. The filter of claim 1, wherein the parallel segment further comprises one or more capacitors being respectively connected in parallel with the first BAWR, the third BAWR, the fifth BAWR, or any combination thereof.

5. The filter of claim 1, wherein:
the resonance frequency of the second BAWR and a resonance frequency of the third BAWR have equivalent values, and
the resonance frequency of the fourth BAWR and a resonance frequency of the fifth BAWR have equivalent values.

6. The filter of claim 1, wherein:
a resonance frequency of the first BAWR and a resonance frequency of the second BAWR have equivalent values, and
a resonance frequency of the third BAWR and a resonance frequency of the fourth BAWR have equivalent values.

7. The filter of claim 1, wherein:
the second BAWR and the first inductor are connected in parallel between two points at which the first series segment is connected to the parallel segment; and
the fourth BAWR and the second inductor are connected in parallel between two points at which the second series segment is connected with the parallel segment.

8. The filter of claim 1, wherein:
the resonance frequency of the second BAWR and the resonance frequency of the third BAWR have equivalent values; and
the resonance frequency of first BAWR, the resonance frequency of the fourth BAWR and the resonance frequency of the fifth BAWR have equivalent values.

9. The filter of claim 1, wherein:
the resonance frequency of the first BAWR, the resonance frequency of the second BAWR and the resonance frequency of the fifth BAWR have equivalent values; and
the resonance frequency of the third BAWR and the resonance frequency of the fourth BAWR have equivalent values.

10. A low pass filter using a bulk acoustic wave resonator (BAWR), the filter comprising:
an input terminal configured to be connected with a first radio frequency (RF) device;
a first BAWR configured to be connected to the input terminal;
a first ladder being connected to the input terminal and the first BAWR, and comprising a second BAWR, a first inductor, and a third BAWR;
a second ladder being connected in series with the first ladder, and comprising a fourth BAWR, a second inductor, and a fifth BAWR; and
an output terminal being connected to the second ladder, and configured to be connected with a second RF device, wherein the second BAWR and the fourth BAWR are connected in series with each other, the third BAWR and the fifth BAWR are connected in parallel with each other, the second BAWR and the first inductor are connected in parallel with each other, and the fourth BAWR and the second inductor are connected in parallel with each other, and a resonance frequency of the second BAWR and a resonance frequency of the fourth BAWR have different values, wherein:
   the second BAWR has a same resonance frequency as one of the first, third, and fifth BAWRs;
   the fourth BAWR has a same resonance frequency as one of the first, third, and fifth BAWRs; or
   the second BAWR has a same resonance frequency as one of the first, third, and fifth BAWRs, and the fourth BAWR has a same resonance frequency as another one of the first, third, and fifth BAWRs; and wherein the output terminal is configured to output to the second RF device one or more signals having a frequency lower than a predetermined frequency among signals input from the first RF device.

11. The filter of claim 10, further comprising:
a third ladder connected in series between the first and the second ladder, and comprising a sixth BAWR, a third inductor, and a seventh BAWR,
wherein the second BAWR, the fourth BAWR, and the sixth BAWR are connected in series with one another, and a resonance frequency of the second BAWR, a resonance frequency of the fourth BAWR, and a resonance frequency of the sixth BAWR are different values.

12. A low pass filter using a bulk acoustic wave resonator (BAWR), the filter comprising:
an input terminal;
an output terminal;
a first series segment having a first bulk acoustic wave resonator (BAWR) and a first inductor connected in parallel;
a second series segment having a second BAWR and a second inductor connected in parallel;
a third BAWR connected between a reference potential and the input terminal;
a fourth BAWR connected between the reference potential and a point between the first and second series segments; and
a fifth BAWR connected between the reference potential and the output terminal;
wherein the first and second series segments are connected in series between the input and output terminals, wherein the third, fourth, and fifth BAWR are connected in parallel, and wherein:
the first BAWR has a same resonance frequency as one of the third, fourth, and fifth BAWRs;
the second BAWR has a same resonance frequency as one of the third, fourth, and fifth BAWRs; or
the first BAWR has a same resonance frequency as one of the third, fourth, and fifth BAWRs, and the second BAWR has a same resonance frequency as another one of the third, fourth, and fifth BAWRs.

13. The filter of claim 12, further comprising first, second, and third capacitors respectively connected in parallel with the third, fourth, and fifth BAWRs.

14. The filter of claim 12, further comprising:
a first capacitor connected between a reference potential and the input terminal;
a second capacitor connected between the reference potential and a point between the first and second series segments; and
a third capacitor connected between the reference potential and the output terminal;
wherein the first, second, and third capacitors are connected in parallel.

15. The filter of claim 12, wherein the first and second BAWRs have different resonance frequencies.

* * * * *